United States Patent [19]

Kakigi

[11] 4,186,343
[45] Jan. 29, 1980

[54] SYNCHRONOUS FREQUENCY SYNTHESIS METHOD FOR A RADIO TRNSMITTER-RECEIVER

[75] Inventor: Takao Kakigi, Inagi, Japan
[73] Assignee: Cybernet Electronic Corp., Kanagawa, Japan
[21] Appl. No.: 793,301
[22] Filed: May 3, 1977
[30] Foreign Application Priority Data Oct. 5, 1976 [JP] Japan ............................ 51-119611

[51] Int. Cl.$^2$ ............................................. H04B 1/38
[52] U.S. Cl. ........................................ 325/17; 325/20; 325/433
[58] Field of Search .................. 325/15, 17, 20, 21, 325/25, 421, 433, 431–432; 343/181

[56] References Cited

U.S. PATENT DOCUMENTS

| | | | |
|---|---|---|---|
| 3,983,484 | 9/1976 | Hodama | 325/421 |
| 4,021,752 | 5/1977 | Sato | 325/421 |
| 4,027,242 | 5/1977 | Yamanaka | 325/25 |
| 4,061,980 | 12/1977 | Sato | 325/421 |
| 4,070,626 | 1/1978 | Binder et al. | 325/25 |

OTHER PUBLICATIONS

"Synthesizer Aims at CB Market", *Electronics*, vol. 49, #19, pp. 162–163, Sep. 16, 1976.

*Primary Examiner*—Benedict V. Safourek
*Assistant Examiner*—Michael A. Masinick
*Attorney, Agent, or Firm*—Oblon, Fisher, Spivak, McClelland & Maier

[57] ABSTRACT

A synchronous frequency synthesis method for a radio transmitter-receiver, having the steps of applying the reference frequency of a fixed-frequency oscillator to a fixed frequency divider and to a second mixer for converting the reference frequency into a second intermediate frequency of the receiving stage, dividing the controlled frequency of a voltage-controlled oscillator by a variable frequency divider, multiplying the controlled frequency to produce a transmitting carrier frequency, applying the controlled frequency to the first mixer of the receiving stage, applying the divided frequency of the fixed frequency divider to a phase detector so as to produce comparison frequencies, inputting either one of the two frequency division step numbers, obtained from the controlled frequencies for transmission and reception and the comparison frequencies, to a shift-applying code converter adapted to convert the difference between the two frequency division step numbers into the sum of or difference between itself and either one of the two frequency division step numbers thereby generating a command code for the variable frequency divider.

4 Claims, 1 Drawing Figure

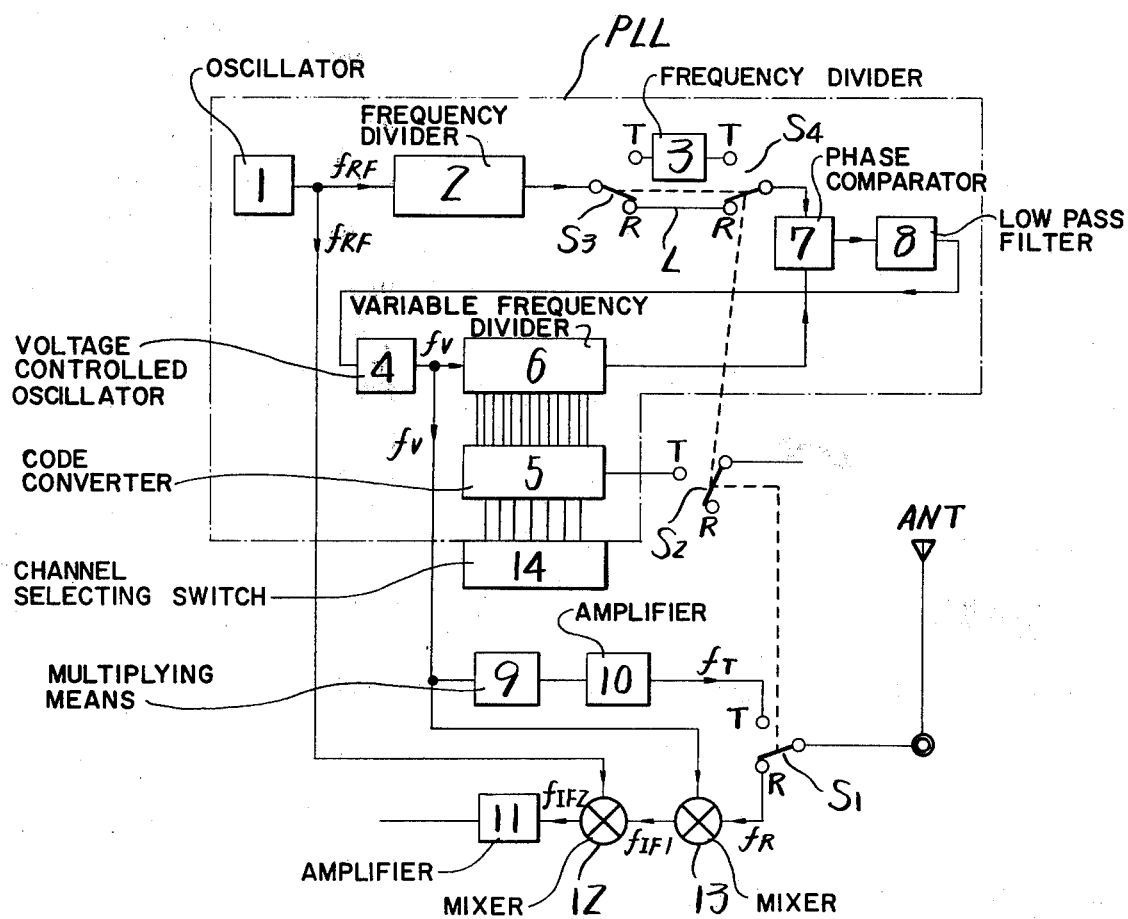

SYNCHRONOUS FREQUENCY SYNTHESIS METHOD FOR A RADIO TRNSMITTER-RECEIVER

BACKGROUND OF THE INVENTION

The present invention relates to a synchronous frequency synthesis method for a radio transmitter-receiver utilizing a phase locked loop.

Regarding the frequency synthesizer utilizing a phase locked loop, there have been proposed several methods which use voltage-controlled oscillation frequencies directly as transmitting and receiving carrier frequencies. In an example where a prescaler is installed to perform frequency division so as to shift up the receiving frequency to obtain the transmitting frequency and where the voltage-controlled frequency is changed at every transmit-receive switching, the self-oscillation frequency of the voltage-controlled oscillator is the same as the transmitting carrier frequency at the amplitude modulation stage and therefore side bands created in amplitude modulation tend to stray into the voltage-controlled oscillator thereby to cause frequency modulation; for this reason, the oscillator section is enclosed with a secure and expensive shield. In this example, the voltage-controlled oscillation frequency is excessively high, and therefore the phase locked loop (PLL) control system is low in stability and in addition, circuit parts must satisfy severe requirements because of a wide range of the voltage-controlled oscillation frequency to be controlled when switching is performed from reception to transmission. In another example where many mixers are used inside and outside of the PLL system such as in the method which uses the oscillation frequency of a single crystal-oscillator as an off-set frequency to perform a digital shift equivalent to the second intermediate frequency when reception is switched to transmission, deterioration of spurious properties are inevitably incurred and, as a result, separate circuit elements or additional parts are disadvantageously required for improvement of spurious properties. Furthermore, the essential part of the above-mentioned PLL is in the form of an integrated circuit of the ECL, TTL or Schottky type, which is inherently large in power consumption and becomes increasingly larger in size if it is to control channel display and peripheral conditions such as digital logic functions, in addition to basic control items.

SUMMARY OF THE INVENTION

It is an object of the present invention to provide a synchronous frequency synthesis method for a radio transmitter-receiver, which can eliminate the above-mentioned disadvantages of the prior art.

It is another object of the present invention to provide a synchronous frequency synthesis method for a radio transmitter-receiver, which can use integrated logic elements of the CMOS type that can satisfy the digital logic control involving a variety of functions and are stable in quality, performance and suitable for mass production.

It is still another object of the present invention to provide a synchronous frequency synthesis method for a radio transmitter-receiver, which can achieve frequency synthesis excellent in spurious properties by digital controlling using a minimized number of parts.

It is a further object of the present invention to provide a synchronous frequency synthesis method for a radio transmitter-receiver, in which the controlled frequencies of the voltage-controlled oscillator for transmission and reception are selected lower than the carrier frequencies for transmission and reception respectively, the difference therebetween corresponding to the first intermediate frequency and in which mixing means are not installed anywhere except in the PLL system.

BRIEF DESCRIPTION OF THE DRAWING

The single FIGURE is a circuit system diagram for explaining a preferred embodiment of the present invention.

DESCRIPTION OF THE PREFERRED EMBODIMENT

Now the present invention will be hereinafter described in detail with reference to the accompanying drawing.

In the drawing, a PLL control system is shown in an area encircled with a dot-dash line. In this FIGURE, the reference numeral 1 designates a fixed oscillator for generating a reference frequency $f_{RF}$, which is applied to a fixed frequency divider 2 and a second mixer 12 of the receiving stage. The divided frequency output of the fixed frequency divider 2 is applied to another frequency divider 3 provided in parallel with a short-circuit conductor L between two sets of transmit-receive switches $S_3$ and $S_4$, where it is further divided down; then the divided frequency output of the frequency divider 3 is applied as a comparison frequency to a phase detector 7 together with the divided frequency output of a variable frequency divider 6, where a frequency difference between both outputs is detected by phase comparison and is fed back to a voltage-controlled oscillator 4 through a low pass filter 8. The controlled frequency $f_V$ of the voltage-controlled oscillator 4 is applied to the variable frequency divider 6 and also to a first mixer 13 as the first local oscillation frequency of the receiving stage; and, in addition, it is multiplied by frequency multiplying means 9 including an operator and frequency multiplier before converted into a transmission carrier frequency $f_T$ through an amplifier 10. Transmit-receive switches $S_1$, $S_2$, $S_3$ and $S_4$ are mutually interlocked, being so constructed that they can be controlled by a control switch (not shown). In addition, the switches $S_3$ and $S_4$ are incorporated in an integrated circuit as semiconductor switches and can be switched according to a logic signal 0 or 1. Reference numeral 5 designates a shift-applying code converter; in which the number of frequency division steps for controlled frequencies outputted from the voltage-controlled oscillator 4 during the transmission and reception periods of each channel are inputted by manipulating a channel-selecting switch 14 such as rotary switch; and in which the sum of or difference between the numbers of frequency division steps for the transmission and reception periods of each channel is computed utilizing the fact that the difference between the numbers of frequency division steps for the transmission and reception periods is constant for all the channels and thereby the required number of bits to be fed to the variable frequency divider 6 is converted into a binary code in each case. It is as a matter of course that the inside logic circuit is switched so as to meet the state of transmission or reception, when switching to transmission or reception is performed. Moreover, as the operator for multiplying the controlled frequency of the voltage-controlled oscillator in the above-mentioned transmission stage is decreased in its multiplication factor, the filter (not shown) to be provided in the subsequent stage may be made smaller in size. Therefore, a balanced modulator may be used as the filter, if it has a computing function.

Now the above facts will be described more concretely using actual numerical values.

First, various frequencies are assumed as follows:

Carrier frequency $f_T$ (for transmission) or $f_R$ (for reception):

$$f_T = f_R = 26.965 \text{ MHz}$$

Reference frequency $f_{RF}$ of the fixed-frequency oscillator:

$$f_{RF} = 10.24 \text{ MHz}$$

First intermediate frequency $f_{IF1}$:

$$f_{IF1} = 10.695 \text{ MHz}$$

Controlled frequency $f_V$ of the voltage-controlled oscillator for the first channel $$f_V = 13.4825 \text{ MHz (for transmission)}$$
$$= 16.27 \text{ MHz (for reception)}$$

Thus, if the comparison frequency is selected to be 2.5 KHz for transmission and 5 KHz for reception, which values are common divisors of the above-mentioned frequencies $f_v$ for transmission and reception respectively, the frequency division ratio of the fixed frequency divider 2 will be 1/2,048 and that of the frequency divider 3 will be ½; in addition, the multiplication degree of the operator of frequency multiplying means 9 will be 2, and the frequency division step number will be 13,4825/2.5=5,393 for transmission and 16,27/5=3,254 for reception. Accordingly, if the number "3,254" is inputted to the shift-applying code converter 5 during a transmission period, the number "3,254+(5,393−3,254)=5,393" will be fed as it is to the variable frequency divider 6 as a binary code. In other words, if the shift-applying code converter 5 is supplied during a transmission period with the frequency division step number "3,254" for producing the voltage-controlled oscillation frequency of the first channel at the time of reception, it will convert that number to a digital frequency division code by adding the shift frequency division number "2,139" to that number and will feed the code to the variable frequency divider 6 as a binary code. In the above-mentioned operation, all the related transmit-receive switches are interlocked with one another, being switched either to the transmission side or to the reception side during the transmission or reception period. As mentioned above, the controlled frequency of the voltage-controlled oscillator 4 for the first channel is 13.4825 MHz for transmission and 16.27 MHz for reception; therefore the difference 2.7875 therebetween is the amount of shift or variation equivalent to the first intermediate frequency. In the above example, the comparison frequencies for transmission and reception are shown as different from each other, but may be the same as a matter of course. When the comparison frequencies for transmission and reception are the same, what must be done is only to make the frequency division ratio of the frequency divider 3 take 1; in this case, therefore, transmit-receive switching becomes unnecessary. In order to properly select the frequency division ratio, in addition, prescalers may be provided before or behind the fixed frequency divider 2 and variable frequency divider 6 or before the phase detector 7, or mixers may be provided in the PLL loop; installation of such additional elements will not change the technical concept of the present invention.

Thus the fixed frequency divider 2, frequency divider 3, shift-applying code converter 5, variable frequency divider 6, phase detector 7 and transmit-receive switches S₃ and S₄ may be integratedly formed as a CMOS type medium-scale integrated circuit system small in power consumption, excellent in performance and reliability, suitable for digital control, and very small in size. In addition, the voltage-controlled oscillator may be of the multi-vibrator type because its frequency variation range is limited; therefore it can be formed integratedly with the above-mentioned integrated circuit system.

As is apparent from the foregoing description, the method according to the present invention has the following features:

The controlled frequency of the voltage-controlled oscillator in the PLL system can be selected far lower than the transmission or reception frequency and, in addition, the comparison frequency and frequency divider ratio may be selected so as to shift the controlled frequency by a frequency equivalent to the first intermediate frequency during transmission or reception. Therefore, it is not necessary to provide mixers used as converter sections for frequency synthesis anywhere except in the PLL system. Accordingly, the system of the present invention is superior in frequency stability to the conventional heterodyne PLL synthesizer, and requires no additional parts for selectivity improvement. Furthermore, even when the voltage-controlled oscillation frequencies for transmission and reception are selected close to each other, the transmitting carrier frequency can be obtained by frequency multiplication and therefore the spurious properties of the system is excellent. Thus the method of the present invention is suitable and advantageous for use in digital logic control, in which various functions are carried out with the minimized number of parts and very small power consumption. Moreover, the controlled frequency of the voltage-controlled oscillator, whose shift at the time of switching corresponds to the first intermediate frequency, may be changed through only a narrow range by the use of the frequency multiplication means; thus the voltage-controlled oscillator can be easily designed because it is free of severe specification conditions.

Obviously, numerous modifications and variations of the present invention are possible in light of the above teachings. It is therefore to be understood that within the scope of the appended claims, the invention may be practiced otherwise than as specifically described herein.

What is claimed is:

1. A synchronous frequency synthesis method for a radio transmitter receiver having a double superheterodyne receiving stage, which comprises the steps of:
    applying a reference frequency outputted from a fixed-frequency oscillator to a fixed frequency divider and to a second mixer for converting said reference frequency into a second intermediate frequency of said double superheterodyne receiving stage, dividing down a controlled frequency outputted from a voltage-controlled oscillator by a variable frequency divider, feeding said divided-down controlled frequency to a phase detector, multiplying said controlled frequency to produce a transmitting carrier frequency, applying said controlled frequency to a first mixer of said double superheterodyne receiving stage for converting said controlled frequency into a first intermediate frequency of said double superheterodyne receiving stage, applying a divided frequency outputted from said fixed frequency divider as a first comparison frequency directly to the phase detector in each reception period to produce an error signal to alter the output of the voltage-controlled oscillator, said first comparison frequency being equal to the frequency of the voltage-controlled oscillator at the time of reception divided by a first frequency division step number and through another frequency divider as a second comparison frequency to the phase detector during each transmission period to produce an error signal to alter the output of the voltage-controlled oscillator, said second comparison frequency being equal to the frequency of the voltage-controlled oscillator at the time of transmission divided by a second frequency division step number, and inputting one of the two frequency division step numbers to a shift-applying code coverter to increase the one of the two frequency division step numbers by a value equal to the difference between said two frequency division step numbers so as to obtain the other of the two frequency division step numbers, and feed the resulting step number as a command code to said variable frequency divider.

2. A synchronous frequency synthesis method for a radio transmitter receiver having a double superheterodyne receiving stage, which comprises the steps of:

applying a reference frequency outputted from a fixed-frequency oscillator to a fixed frequency divider and to a second mixer for converting said reference frequency into a second intermediate frequency of said double superheterodyne receiving stage, dividing down a controlled frequency outputted from a voltage-controlled oscillator by a variable frequency divider, feeding said divided-down controlled frequency to a phase detector, multiplying said controlled frequency to produce a transmitting carrier frequency, applying said controlled frequency to a first mixer of said double superheterodhyne receiving stage for converting said controlled frequency into a first intermediate frequency of said double superheterodyne receiving stage, applying a divided frequency outputted from said fixed frequency divider as a first comparison frequency directly to the phase detector in each reception period to produce an error signal to alter the output of the voltage-controlled oscillator, said first comparison frequency being equal to the frequency of the voltage-controlled oscillator at the time of reception divided by a first frequency division step number and through another frequency divider as a second comparison frequency to the phase detector during each transmission period to produce an error signal to alter the output of the voltage-controlled oscillator, said second comparison frequency being equal to the frequency of the voltage-controlled oscillator at the time of transmission divided by a second frequency division step number, and inputting one of the two frequency division step numbers to a shift-applying code converter to decrease the one of the two frequency division step numbers by a value equal to the difference between the two step numbers so as to obtain the other of the two frequency division step numbers, and feed the resulting step number as a command code to said variable frequency divider.

3. A synchronous frequency synthesis method for a radio transmitter receiver having a double superheterodyne receiving stage, which comprises the steps of:

applying a reference frequency outputted from a fixed-frequency oscillator to a fixed frequency divider and to a second mixer for converting said reference frequency into a second intermediate frequency of said double superheterodyne receiving stage, dividing down a controlled frequency outputted from a voltage-controlled oscillator by a variable frequency divider, feeding said divided-down controlled frequency to a phase detector, multiplying said controlled frequency to produce a transmitting carrier frequency, applying said controlled frequency to a first mixer of said double superheterodyne receiving stage for converting said controlled frequency into a first intermediate frequency of said double superheterodyne receiving stage, applying a divided frequency outputted from said fixed frequency divider as a first comparison frequency directly to the phase detector in each reception period to produce an error signal to alter the output of the voltage-controlled oscillator, said first comparison frequency being equal to the frequency of the voltage-controlled oscillator at the time of reception divided by a first frequency division step number and as a second comparison frequency to the phase detector during each transmission period to produce an error signal to alter the output of the voltage-controlled oscillator, said second comparison frequency being equal to the frequency of the voltage-controlled oscillator at the time of transmission divided by a second frequency division step number, and inputting one of the two frequency division step numbers to a shift-applying code converter to increase the one of the two frequency division step numbers by a value equal to the difference between said two frequency division step numbers so as to obtain the other of the two frequency division step numbers, and feed the resulting step number as a command code to said variable frequency divider.

4. A synchronous frequency synthesis method for a radio transmitter receiver having a double superheterodyne receiving stage, which comprises the steps of:

applying a reference frequency outputted from a fixed-frequency oscillator to a fixed frequency divider and to a second mixer for converting said reference frequency into a second intermediate frequency of said double superheterodyne receiving stage, dividing down a controlled frequency outputted from a voltage-controlled oscillator by a variable frequency divider, feeding said divided-down controlled frequency to a phase detector, multiplying said controlled frequency to produce a transmitting carrier frequency, applying said controlled frequency to a first mixer of said double superheterodyne receiving stage for converting said controlled frequency into a first intermediate frequency of said double superheterodyne receiving stage, applying a divided frequency outputted from said fixed frequency divider as a first comparison frequency directly to the phase detector in each reception period to produce an error signal to alter the output of the voltage-controlled oscillator, said first comparison frequency being equal to the frequency of the voltage-controlled oscillator at the time of reception divided by a first frequency division step number and as a second comparison frequency to the phase detector during each transmission period to produce an error signal to alter the output of the voltage-controlled oscillator, said second comparison frequency being equal to the frequency of the voltage-controlled oscillator at the time of transmission divided by a second frequency division step number, and inputting one of the two frequency division step numbers to a shift-applying code converter to decrease the one of the two frequency division step numbers by a value equal to the difference between the two step numbers so as to obtain the other of the two frequency division step numbers, and feed the resulting step number as a command code to said variable frequency divider.

* * * * *